United States Patent
Ono et al.

(10) Patent No.: US 9,142,627 B2
(45) Date of Patent: Sep. 22, 2015

(54) SEMICONDUCTOR DEVICE

(71) Applicant: KABUSHIKI KAISHA TOSHIBA, Tokyo (JP)

(72) Inventors: Syotaro Ono, Ishikawa (JP); Masaru Izumisawa, Ishikawa (JP); Hideyuki Ura, Ishikawa (JP); Hiroaki Yamashita, Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/473,718

(22) Filed: Aug. 29, 2014

(65) Prior Publication Data

US 2015/0200248 A1   Jul. 16, 2015

(30) Foreign Application Priority Data

Jan. 10, 2014  (JP) ................. 2014-003369

(51) Int. Cl.
  *H01L 29/66* (2006.01)
  *H01L 29/40* (2006.01)
  *H01L 29/06* (2006.01)
  *H01L 29/423* (2006.01)

(52) U.S. Cl.
  CPC ........... *H01L 29/407* (2013.01); *H01L 29/0634* (2013.01); *H01L 29/42368* (2013.01)

(58) Field of Classification Search
  CPC ............. H01L 29/0634; H01L 29/407; H01L 29/42368

USPC .................... 257/330, 331; 438/270
See application file for complete search history.

(56) References Cited

U.S. PATENT DOCUMENTS

| | | | |
|---|---|---|---|
| 6,849,880 | B1 | 2/2005 | Saito et al. |
| 7,417,284 | B2 | 8/2008 | Yamauchi et al. |
| 7,642,597 | B2 | 1/2010 | Saito |
| 7,645,661 | B2 | 1/2010 | Kobayashi |
| 2008/0135930 | A1* | 6/2008 | Saito ............................ 257/330 |
| 2014/0117445 | A1 | 5/2014 | Kimura et al. |

FOREIGN PATENT DOCUMENTS

JP   2008124346 A   5/2008

* cited by examiner

*Primary Examiner* — Julio J Maldonado
*Assistant Examiner* — Hajar Kolahdouzan
(74) *Attorney, Agent, or Firm* — Patterson & Sheridan, LLP

(57) ABSTRACT

A semiconductor device includes a first layer of a first conductivity type between a first and a second electrode. A second layer of the first conductivity type is between the first layer and the second electrode. A pair of third layers of a second conductivity type has a first portion in the first layer and a second portion contacting the second layer. A fourth layer is between the second layer and the second electrode and between the third layers and the second electrode. A fifth layer is between the fourth layer and the second electrode. A third electrode is adjacent to the second layer via a first insulating film. A fourth electrode is between the second electrode and the third electrode and adjacent to the fourth semiconductor layer via a second insulating film. The second insulating film is thinner than the first insulating film.

20 Claims, 6 Drawing Sheets

SEMICONDUCTOR DEVICE

CROSS-REFERENCE TO RELATED APPLICATION

This application is based upon and claims the benefit of priority from Japanese Patent Application No. 2014-003369, filed Jan. 10, 2014, the entire contents of which are incorporated herein by reference.

FIELD

Embodiments described herein relate generally to a semiconductor device.

BACKGROUND

As a semiconductor device for electric power control, which achieves both a high breakdown voltage and low on-resistance, there is a vertical type Metal Oxide Semiconductor Field Effect Transistor (MOSFET) that has a Super Junction structure (hereinafter, referred to as an "SJ structure") in which p type (or n type) semiconductor regions are embedded in n type (or p type) semiconductor regions and n type regions and p type regions are alternately arranged with each other.

In the SJ structure, pseudo non-doped areas are prepared by matching the n type dopant amount included in the n type regions and p type dopant amount included in the p type regions, and thus high breakdown voltage is provided. At the same time, it is also possible to increase the dopant concentration in the n type regions to lower on-resistance.

As one method of forming the SJ structure, there is, for example, a method of forming trenches in an n type semiconductor layer, and then embedding p type semiconductor material in the trenches thus formed. However, in this method, cavity parts (voids) are often left in the p type semiconductors due to incomplete filling of the trenches with the p type semiconductor material. If the voids are formed, there is a problem in that leakage current can be increased due to stress caused by the cavity parts.

When the pitches of the SJ structure are reduced in order to reduce on-resistance in a MOSFET device, the aspect ratio of the trenches into which the p type semiconductor material is to be embedded becomes high. Therefore, the problem of the formation of the cavity parts becomes even more prevalent, and thus the manufacture is difficult.

DETAILED DESCRIPTION

Figure 1:
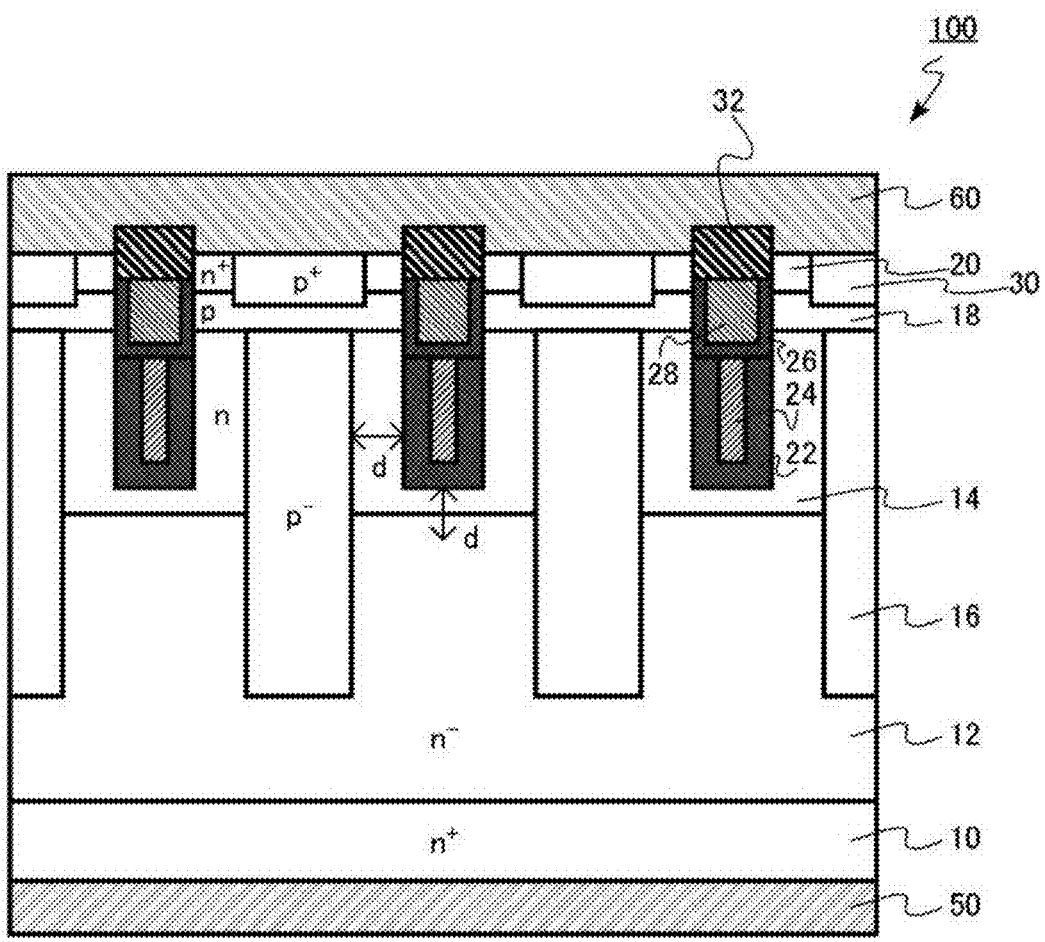
FIG. 1 is a schematic cross-sectional view illustrating a semiconductor device according to a first embodiment.

In general, according to an embodiment, a semiconductor device includes a first semiconductor layer of a first conductivity type disposed between a first electrode and a second electrode and a second semiconductor layer of the first conductivity disposed between the first semiconductor layer and the second electrode. The second semiconductor layer has a first conductivity type dopant concentration that is greater than a first conductivity type dopant concentration of the first semiconductor layer. A pair of third semiconductor layers of a second conductivity type are further included. The third semiconductor layers in the pair are spaced from each other in a first direction. Each third semiconductor layer extends in a second direction perpendicular to the first direction and has a first portion disposed in the first semiconductor layer and a second portion that is closer, in the second direction, than the first portion to the second electrode and contacting the second semiconductor layer. A fourth semiconductor layer of the second conductivity type is between the second semiconductor layer and the second electrode and between the each third semiconductor layer and the second electrode. The fourth semiconductor layer has a second conductivity type dopant concentration that is greater than a second conductivity type dopant concentration of each of the third semiconductor layers. A fifth semiconductor layer of the first conductivity type is disposed between the fourth semiconductor layer and the second electrode. The fifth semiconductor layer has a first conductivity type dopant concentration that is greater than the first conductivity type dopant concentration of the second semiconductor layer. A third electrode is between the pair of third semiconductor layers and adjacent to the second semiconductor layer via a first insulating film. A fourth electrode is between the second electrode and the third electrode and adjacent to the fourth semiconductor layer via a second insulating film. The second insulating film is thinner is thinner in a direction perpendicular to the second direction than the first insulating film.

As used herein, "layer" may refer to material formed via film deposition techniques (e.g., chemical vapor deposition, epitaxial growth, etc.) or a portion of a material that has been differently processed so as to become distinguishable from other portions of the material (e.g., by ion implantation, patterning, or the like).

Hereinafter, exemplary embodiments will be described with reference to the accompanying drawings. The same reference numerals are used to indicate the same components in different and the description of components which is explained once may be omitted. In the examples a first conductivity type is an n type and a second conductivity type is a p type will be described, but the opposite configuration may be adopted.

In addition, as used in this context, $n^+$ type, n type, and $n^-$ type lists the n type dopant concentration in decreasing relative order. That is, $n^+$ type material has a higher n dopant concentration than n type material, which in turn has a higher n dopant concentration than $n^-$ type material. In the same manner, the description of $p^+$ type, p type, and $p^-$ type lists the p type dopant concentrations in decreasing relative order.

An n type dopant is, for example, phosphorus (P) or arsenic (As). In addition, a p type dopant is, for example, boron (B).

First Embodiment

A semiconductor device according to the first embodiment includes: a drain electrode; a source electrode; a first conductivity type first semiconductor layer that is provided between the drain electrode and the source electrode; a plurality of first conductivity type second semiconductor layers that are provided between the first semiconductor layer and the source electrode and that has higher first conductivity type dopant concentration than the first semiconductor layer; a plurality of second conductivity type third semiconductor layers that include end portions on a side of the drain electrode which are present in the first semiconductor layer and that are provided to come into contact with the first semiconductor layer and the second semiconductor layer; a plurality of second conductivity type fourth semiconductor layers that are provided between the second semiconductor layer, the third semiconductor layer, and the source electrode; a first conductivity type fifth semiconductor layer that is provided between the fourth semiconductor layers and the source electrode, and that has higher first conductivity type dopant concentration than the second semiconductor layers; a field plate electrode that is disposed in the second semiconductor layer and with a first insulating film interposed between the field plate electrode and the second semiconductor layer; and a gate electrode that is provided such that a second insulating film, which is thinner than the first insulating film, is interposed between the gate electrode and the fourth semiconductor layer.

FIG. 1 is a schematic cross-sectional view illustrating the semiconductor device according to the first embodiment. A semiconductor device 100 depicted in FIG. 1 is a vertical-type MOSFET which includes a super junction structure. In addition, the semiconductor device 100 is a trench gate-type MOSFET in which a gate electrode is provided in a trench.

The semiconductor device (MOSFET) 100 includes a drain electrode 50 and a source electrode 60. Further, the semiconductor device (MOSFET) 100 includes an n$^+$ type semiconductor layer 10 between the drain electrode 50 and the source electrode 60. The n$^+$ type semiconductor layer 10 is, for example, single crystal silicon layer that contains an n type dopant. The n$^+$ type semiconductor layer 10 may also be referred to as semiconductor substrate 10.

The semiconductor device (MOSFET) 100 includes an n$^-$ type semiconductor layer (first semiconductor layer) 12 on the n$^+$ type substrate 10. The n type dopant concentration of the n$^-$ type semiconductor layer 12 is lower than the n type dopant concentration of the n$^+$ type substrate 10.

An n type semiconductor layer (second semiconductor layer) 14 is provided on the n$^-$ type semiconductor layer 12. The n type semiconductor layer 14 is connected to the n$^-$ type semiconductor layer 12. The n type dopant concentration of the n type semiconductor layer 14 is higher than the n type dopant concentration of the n$^-$ type semiconductor layer 12. The n type dopant concentration of the n type semiconductor layer 14 is, for example, equal to or greater than 1.5 times the n type dopant concentration of the n$^-$ type semiconductor layer 12 and equal to or less than 10 times the n type dopant concentration of the n$^-$ type semiconductor layer 12.

The n type dopant concentration of the n$^-$ type semiconductor layer 12 is, for example, greater than or equal to $1\times10^{14}$ cm$^{-3}$ and equal to or less than $1\times10^{16}$ cm$^{-3}$. The n type dopant concentration of the n type semiconductor layer 14 is, for example, equal to or greater than $1.5\times10^{14}$ cm$^{-3}$ and equal to or less than $1\times10^{17}$ cm$^{-3}$.

The n$^+$ type semiconductor layer 10 functions as a drain contact area of the MOSFET 100. In addition, the n$^-$ type semiconductor layer 12 and the n type semiconductor layer 14 are the drift regions of the MOSFET 100.

A plurality of p$^-$ type semiconductor layers (third semiconductor layers) 16 contact the n$^-$ type semiconductor layer 12 and the n type semiconductor layer 14. That is, the end portions of the p$^-$ type semiconductor layers 16 on the side of the drain electrode 50 (e.g., the lower ends in FIG. 1) are present at a same level as the n$^-$ type semiconductor layer 12. The p$^-$ type semiconductor layers 16 penetrate through some portion of n$^-$ type semiconductor layer 12 (extend in the up-down direction in FIG. 1), reach the n type semiconductor layer 14, and penetrate into the n type semiconductor layer 14. The end portions of the p$^-$ type semiconductor layers 16 on the side of the source electrode 60 are at a same level as the n type semiconductor layer 14 in this example embodiment.

The p$^-$ type semiconductor layers 16 are arranged and disposed between portions of the n$^-$ type semiconductor layer 12 and portions of the n type semiconductor layer 14 to form an SJ structure. The SJ structure has a function of causing depletion layers to easily extend into the n$^-$ type semiconductor layer 12 and the n type semiconductor layer 14 when a reverse voltage is applied as in a case of the gate-off (non-conducting) operation of the MOSFET 100.

A p type semiconductor layer (fourth semiconductor layer) 18 is provided between the n type semiconductor layer 14 and the source electrode 60, and each p$^-$ type semiconductor layer 16 and the source electrode 60. P type semiconductor layers 18 contact the n type semiconductor layer 14 and each p$^-$ type semiconductor layer 16.

An n$^+$ type semiconductor layer (fifth semiconductor layer) 20 is provided between each p type semiconductor layer 18 and the source electrode 60. The n type dopant concentration of the n$^+$ type semiconductor layer 20 is higher than the n type dopant concentration of the n type semiconductor layer 14.

A field plate electrode 24 is provided in the n type semiconductor layer 14 and such that a first insulating film 22 is interposed between the field plate electrode 24 and the n type semiconductor layer 14. The field plate electrode 24 is provided in a trench in the n type semiconductor layer 14. The first insulating film 22 is provided on the inner wall of the trench.

The first insulating film 22 is, for example, a silicon oxide film. The field plate electrode 24 is, for example, polycrystalline silicon which contains an n type dopant.

The field plate electrode 24, the first insulating film 22, and the n type semiconductor layer 14 between adjacent p$^-$ type semiconductor layers 16. These elements disposed as depicted in FIG. 1 may collectively be referred to as a "Field Plate structure" ("FP structure").

The thickness of the first insulating film 22 is, for example, equal to or greater than 100 nm and equal to or less than 400 nm. The thickness of the first insulating film 22 is optimized from a viewpoint of n type semiconductor layer 14 depletion.

In addition, the arrangement of the p– type semiconductor layers 16 between the n$^-$ type semiconductor layer 12 and the n type semiconductor layer 14, collectively, corresponds to a superjunction (SJ) structure. In this embodiment, the SJ structure alone is provided in the lower part (side of the drain electrode 50) of the drift region of the MOSFET 100, and both the FP structure and the SJ structure are provided in the upper part (side of the source electrode 60) of the drift region.

Figure 2:
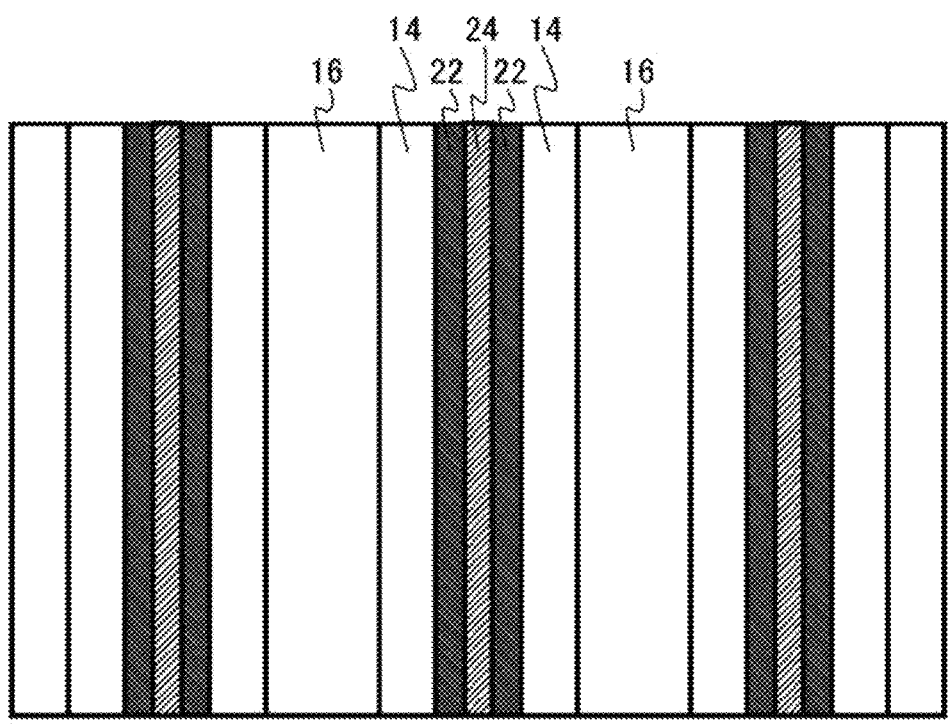
FIG. 2 is a view illustrating layouts of an SJ structure and field plate structure of the semiconductor device according to the first embodiment.

FIG. 2 is a view illustrating layouts of the SJ structure and the FP structure of the semiconductor device according to the first embodiment. FIG. 2 illustrates a cross section through the field plate electrode 24 along a plane that parallel to the boundary surface between the n– type semiconductor layer 12 and the n type semiconductor layer 14.

In the MOSFET 100, the p$^-$ type semiconductor layers 16 included in the SJ structure and the field plate electrode 24 included in the FP structure are respectively disposed with stripe-shaped patterns. That is, these elements extend in a direction orthogonal to the page plane (e.g., into the page) of FIG. 1. Furthermore, in this example embodiment, as depicted in FIG. 2, the p$^-$ type semiconductor layers 16 extend in parallel with the field plate electrode 24. That is, the p⁻ type semiconductor layers 16 and the field plate electrode 24 form a stripe pattern.

As depicted in FIG. 1, a gate electrode 28 is disposed between adjacent p⁻ type semiconductor layers 16. A second insulating film 26 is interposed between the p⁻ type semiconductor layers 16 and the gate electrode 28. The thickness (corresponding to the distance between gate electrode 28 and p type semiconductor layers 18 or n type semiconductor layer 14) of the second insulating film 26 is less than a thickness (corresponding to the distance between field plate electrode 24 and n type semiconductor layer 14) of the first insulating film 22.

The gate electrode 28 is provided in a trench which is formed in the n type semiconductor layer 14. The second insulating film 26 is formed on the inner wall of the trench.

The gate electrode 28 and the field plate electrode 24 are formed in the same trench. An insulating film is provided between the gate electrode 28 and the field plate electrode 24, and thus the gate electrode 28 is electrically separated from the field plate electrode 24.

The second insulating film 26 is, for example, a silicon oxide film. The gate electrode 28 is, for example, polycrystalline silicon which contains the n type dopant.

The thickness of the second insulating film 26 is, for example, equal to or greater than 50 nm and equal to or less than 200 nm. The thickness of the second insulating film 26 is optimized from the standpoint of the securing an on-state current and reliability.

Further, a p⁺ type semiconductor layer (sixth semiconductor layer) 30 is provided between the p type semiconductor layers 18 and the source electrode 60. The p type dopant concentration of the p⁺ type semiconductor layer 30 is higher than the p type dopant concentration of the p type semiconductor layers 18.

The MOSFET 100 is a trench gate-type MOSFET in which the gate electrode 28 is formed in the trench. The second insulating film 26 functions as a gate insulating film. The n⁺ type semiconductor layer 20 functions as the source area of the MOSFET. The n type semiconductor layer 14 functions as the drain area of the MOSFET. The p type semiconductor layers 18 functions as the channel area (base area) of the MOSFET. The p⁺ type semiconductor layer 30 functions as a channel contact area (base contact area).

The n⁺ type semiconductor layer 20 comes into contact with the second insulating film 26. In addition, the n type semiconductor layer 14 comes into contact with the second insulating film 26.

The source electrode 60 is provided on the surfaces of the n⁺ type semiconductor layer 20 and the p⁺ type semiconductor layer 30. The source electrode 60 is, for example, metal. It is preferable that the n+ type semiconductor layer 20 and the p⁺ type semiconductor layer 30 are connected in a manner of ohmic contact to the source electrode 60.

The drain electrode 50 is provided on the surface of the n⁺ type substrate 10 such that the n⁺ type substrate 10 is between the n⁻ type semiconductor layer 12 and the drain electrode 50. The drain electrode 50 is, for example, metal. It is preferable that the n+ type substrate 10 and the drain electrode 50 are connected in a manner of ohmic contact.

A third insulating film 32 is provided between the gate electrode 28 and the source electrode 60. The third insulating film 32 electrically separates the gate electrode 28 from the source electrode 60. The third insulating film 32 is, for example, a silicon oxide film.

In addition, the field plate electrode 24 is electrically connected to the source electrode 60.

The n⁺ type semiconductor layer 10, the n⁻ type semiconductor layer 12, the n type semiconductor layer 14, the p⁻ type semiconductor layers 16, the p type semiconductor layers 18, the n⁺ type semiconductor layer 20, and the p⁺ type semiconductor layer 30 are, for example, single crystal silicon. And while described as layers in this embodiment, some or all of these elements may be implemented as regions of a common substrate or portions of a single layer. Such regions or portions may be formed by, for example, ion implantation methods.

But, in general, any known method of manufacturing the SJ structure and the FP structure may be adopted and the disclosed device embodiments are not limited to any particular method of manufacture. It is possible to manufacture the SJ structure using, for example, a method of embedding and growing the p type semiconductor layers 16 in trench grooves, a method of repeating injection ions of forming the p type semiconductor layers 16 and epitaxial silicon growth, and a method of forming the p type semiconductor layers 16 with high speed ion injection, or the like.

In addition, it is possible to manufacture the FP structure using, for example, a method of forming the trench, forming the first insulating film 22 using a thermal oxidation method, embedding and forming the field plate electrode 24 using an etch back method, etching back the first insulating film 22, and embedding the second insulating film 26 and the gate electrode 28.

Operations and advantages of embodiments will be described.

When the pitch of the SJ structure, that is, the length of the repeating unit of the p type layers (p type area), is small, it is possible to cause the concentration of the n type layer (n type area) sandwiched between the p type layers to be high concentration, and thus it is possible to reduce on-resistance. However, when the pitch of the SJ structure becomes smaller, it is harder to form the p type layers.

For example, in a method of embedding and growing the p type layer in the trench groove formed in the n type layer, it becomes necessary to embed the p type layer in a trench groove having a high aspect ratio. When the aspect ratio of the trench is high, a cavity part (void) is prone to being formed in the embedded p type layer. If the cavity part is formed, there is a problem that leakage current is increased due to stress caused by the presence of the cavity part.

Figure 3:
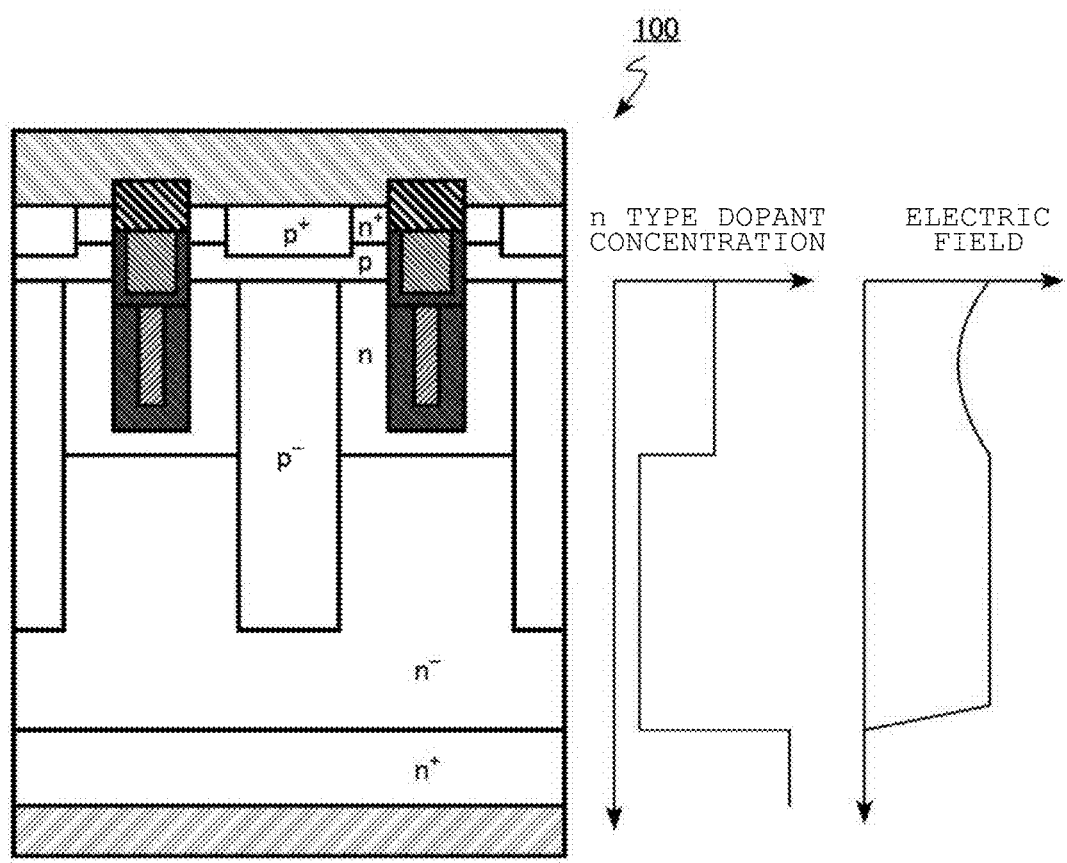
FIG. 3 is a view illustrating an operation of the semiconductor device according to the first embodiment.

FIG. 3 is a view illustrating the operation of the semiconductor device similar to that depicted in FIG. 1. FIG. 3 illustrates the cross section of MOSFET 100, the n type dopant concentration of the drift region, and the distribution of the electric field in an off-state (nominally non-conducting between source and drain electrodes).

As described above, the FP structure is provided in the upper part of the drift region (side closer to the source electrode 60) in addition to the SJ structure. Further, in the upper part of the drift region, the n type semiconductor layer 14 that has higher n type dopant concentration than the n⁻ type semiconductor layer 12 in the lower part of the drift region (side closer to the drain electrode 50) is provided.

As shown in the electric field of FIG. 3, the depletion of the n type layer is promoted due to the presence of the FP structure. Therefore, it is possible to perform suppression such that the electric field in the n type semiconductor layer 14 such that a peak electric field concentration is equal to or lower than the electric field in the n⁻ type semiconductor layer 12. Therefore, in MOSFET 100, it is possible to reduce on-resistance while providing a high breakdown voltage as compared to a device in which the n type semiconductor layer 14 (having a high n type dopant concentration) is not provided.

In addition, the field plate electrode 24 is electrically separated from the gate electrode 28, and the field plate electrode 24 is electrically connected to the source electrode 60. With this configuration, the capacitance between the gate electrode and the drain area (gate-drain capacitance) is reduced. Therefore, a MOSFET that has a higher switching speed is provided. The field plate electrode 24 maybe electrically connected to the gate electrode 28. In this case, an insulating film between two electrodes is not necessary.

It is preferable that the n type dopant concentration of the n type semiconductor layer 14 be equal to or greater than 1.5 times the n type dopant concentration of the n⁻ type semiconductor layer 12 and be equal to or less than 10 times the n type dopant concentration of the n⁻ type semiconductor layer 12. It is further preferable that the n type dopant concentration of the n type semiconductor layer 14 be equal to or greater than 4 times the n type dopant concentration of the n⁻ type semiconductor layer 12 and be equal to or less than 6 times the n type dopant concentration of the n⁻ type semiconductor layer 12. When the n type dopant concentration of the n type semiconductor layer 14 is lower than the above range, the on-resistance may be higher than acceptable. In addition, if the n type dopant concentration of the n type semiconductor layer 14 is higher than the above range, it is hard to deplete the n type semiconductor layer 14, and the breakdown voltage becomes small.

In addition, when the distance between the p⁻ type semiconductor layers 16 and the first insulating film 22 is set to d (refer to FIG. 1), the boundary (interface) between the n⁻ type semiconductor layer 12 and the n type semiconductor layer 14 is preferably less than the distance d from the end portion of the first insulating film 22 on the side of the drain electrode 50. When the boundary between n⁻ type semiconductor layer 12 and the n type semiconductor layer 14 is greater than distance d from the end portion of the first insulating film, it is difficult to deplete the n type semiconductor layer 14 which is present on the side of the drain electrode 50 with regard to the first insulating film 22, and thus there is a problem that breakdown voltage becomes small.

It is possible to define and specify the boundary between the n⁻ type semiconductor layer 12 and the n type semiconductor layer 14 as, for example, the inflection point of the concentration profile of the n type dopant in the layers.

When a manufacturing tolerances are taken into consideration, the boundary between the n⁻ type semiconductor layer 12 and the n type semiconductor layer 14 may be closer to the source electrode 60 than is the lower end portion of the first insulating film 22. It is preferable that the boundary between the n⁻ type semiconductor layer 12 and the n type semiconductor layer 14 be closer to the drain electrode 50 than is the upper end portion of the field plate electrode 24.

Second Embodiment

A semiconductor device according to a second embodiment is similar to the first embodiment excepting that the field plate electrode 24 and the gate electrode 28 are physically and electrically connected. Therefore, the description of content repeated from the first embodiment will be omitted.

Figure 4:
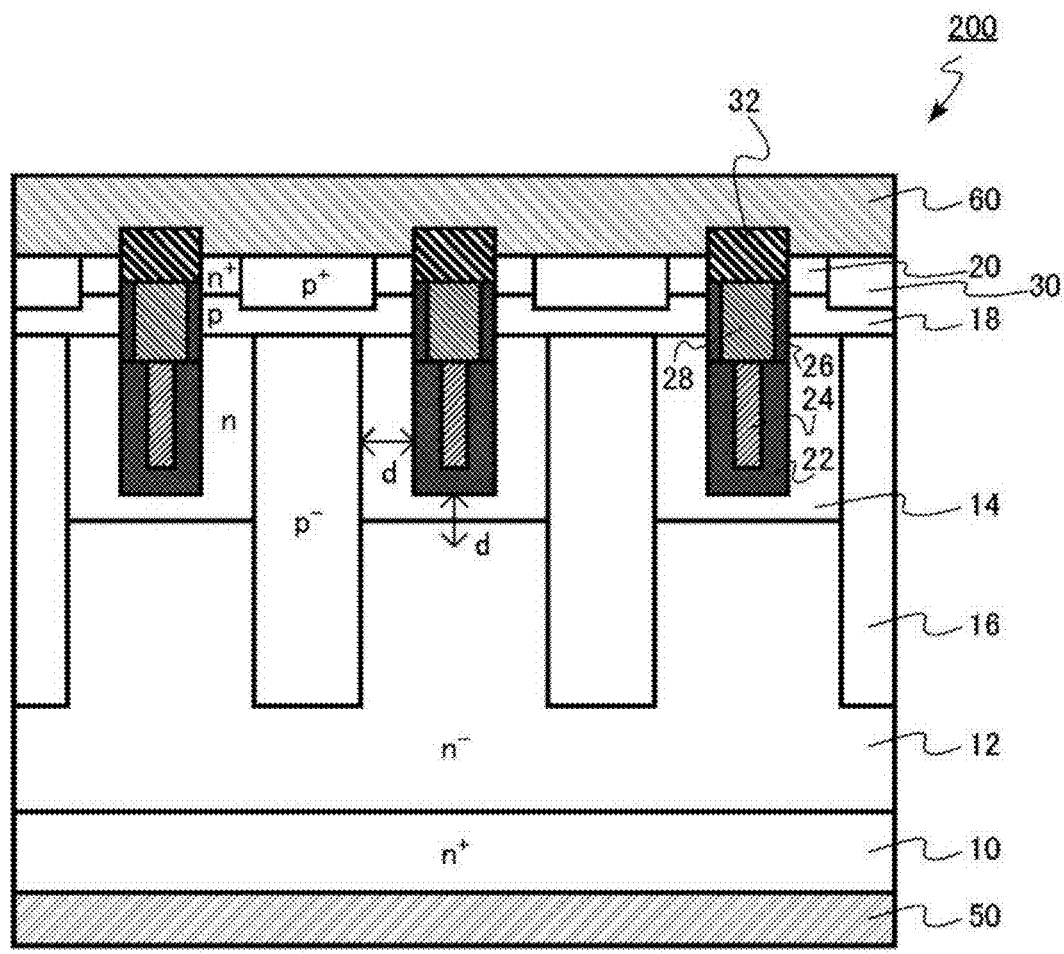
FIG. 4 is a schematic cross-sectional view illustrating a semiconductor device according to a second embodiment.

FIG. 4 is a schematic cross-sectional view illustrating a semiconductor device according to the second embodiment. In a semiconductor device 200 according to the second embodiment, a field plate electrode 24 is physically and electrically connected to a gate electrode 28.

According to the second embodiment, it is possible to make structure for supplying an electrical potential to the field plate electrode 24 and structure for supplying an electrical potential to the gate electrode 28 be mutual—that is, shared or in common. Therefore, it is possible to omit a structure for connecting the field plate electrode 24 to an extraction electrode or other external connection, and thus it is possible to reduce the size of the semiconductor device.

Third Embodiment

A semiconductor device according to a third embodiment is similar to that according to the first embodiment excepting that the pattern of a third semiconductor layer and the pattern of a field plate electrode are respectively stripe-shaped patterns and the pattern of the third semiconductor layer is perpendicular to the pattern of the field plate electrode.

Figure 5:
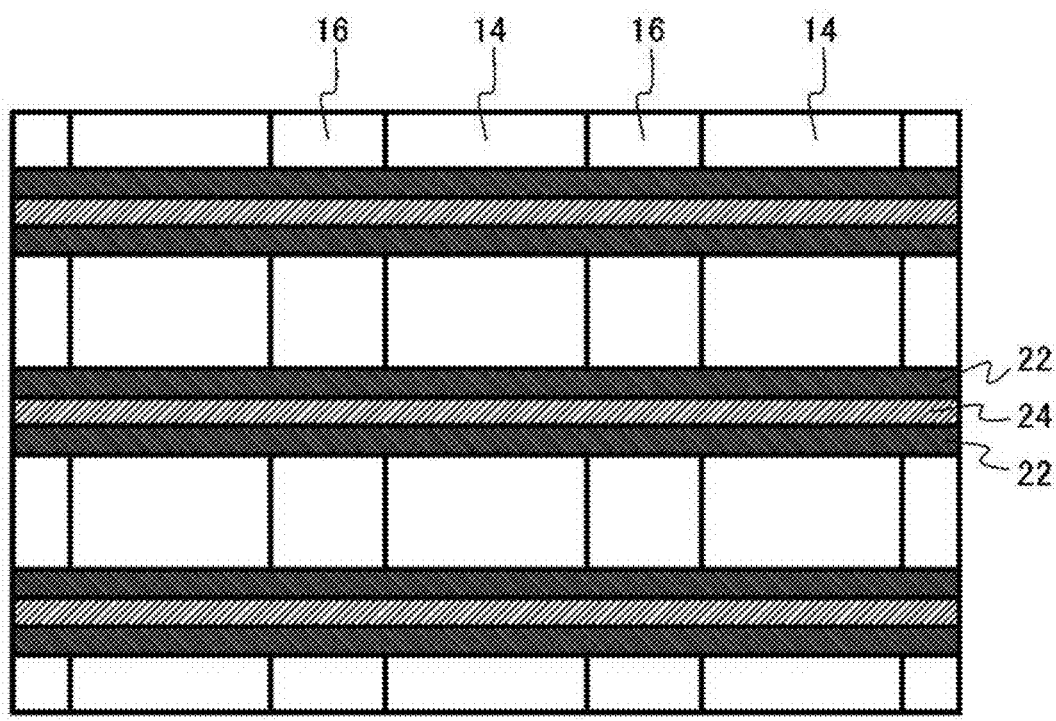
FIG. 5 is a view illustrating layouts of an SJ structure and a field plate structure of a semiconductor device according to a third embodiment.

FIG. 5 is a view illustrating the layouts of the SJ structure and the FP structure of the semiconductor device according to the embodiment. FIG. 5 illustrates a cross section through n type semiconductor layer 14 on a plane that is parallel to a boundary surface between n⁻ type semiconductor layer 12 and n type semiconductor layer 14.

In a MOSFET according to the third embodiment, p⁻ type semiconductor layers 16 included in the SJ structure and a field plate electrode 24 included in the FP structure are respectively disposed with stripe-shaped patterns. Furthermore, the patterns of the p⁻ type semiconductor layers 16 are perpendicular to the pattern of the field plate electrode 24.

According to the embodiment, when the pattern of the field plate electrode 24 is formed, even when misalignment (overlay error) occurs with respect to the patterns of the p⁻ type semiconductor layers 16, it is possible to suppress variation in the characteristics of the semiconductor device. That is, for example, if misalignment is generated when the patterns of the p⁻ type semiconductor layers 16 are parallel to the pattern of the field plate electrode 24 as in the first embodiment, the distance between the p⁻ type semiconductor layers 16 and the n type semiconductor layer 14 is changed. Therefore, for example, there is a problem in that variation in a breakdown voltage or variation in the on-state current is generated.

According to the third embodiment, since the patterns of the p⁻ type semiconductor layers 16 are perpendicular to the pattern of the field plate electrode 24, the SJ structure and the FP structure are not substantially changed even when misalignment between layer patterns is generated. Therefore, it is possible to implement a semiconductor device with more stable characteristics due to wider process latitude during manufacture.

Fourth Embodiment

A semiconductor device according to a fourth embodiment is different from that according to the first embodiment in that the pattern of a third semiconductor layer is a dot shape (island shape) instead of the stripe shape.

Figure 6:
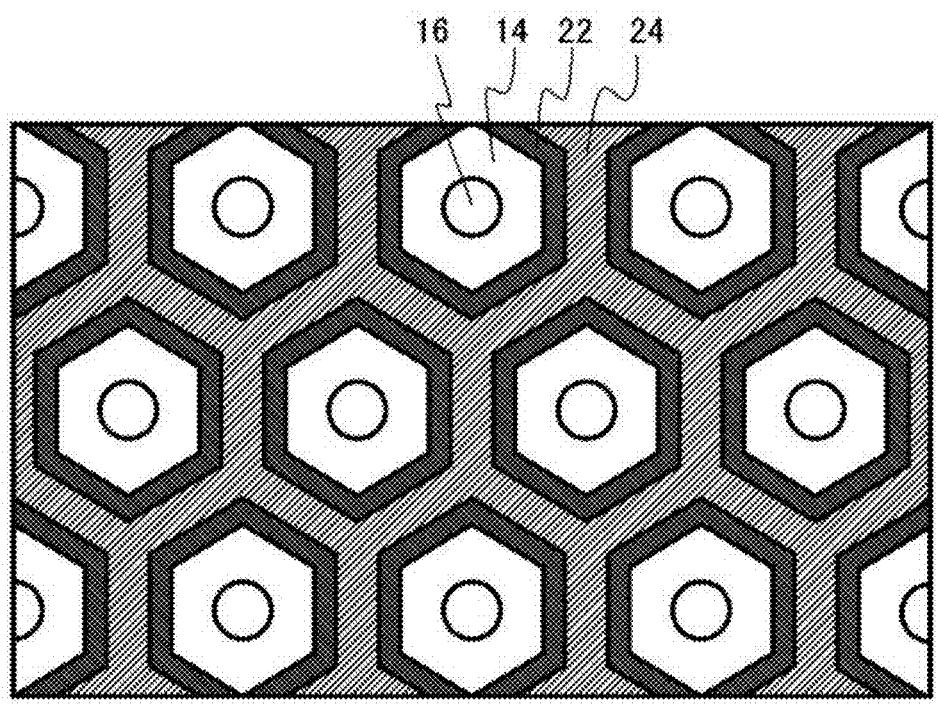
FIG. 6 is a view illustrating layouts of an SJ structure and a field plate structure of a semiconductor device according to a fourth embodiment.

FIG. 6 is a view illustrating the layouts of the SJ structure and the FP structure of the semiconductor device according to the fourth embodiment. FIG. 6 illustrates a cross section through n type semiconductor layer 14 along a plane that is parallel to a boundary surface between an n⁻ type semiconductor layer 12 and the n type semiconductor layer 14.

In a MOSFET according to the fourth embodiment, p⁻ type semiconductor layers 16 included in the SJ structure are dot-shaped patterns. As depicted in FIG. 6, the dot-shaped pattern is a regular array with equal spacing between directly adjacent dots in the array. In addition, a field plate electrode 24 included in the FP structure is a mesh-shaped pattern—that is, field plate electrode 24 is between the p⁻ type semiconductor layers 16 in the dot-shaped pattern.

Hereinbefore, example embodiments in which the first conductivity type is the n type and the second conductivity type is the p type have been described. However, a configuration in which the first conductivity type is the p type and the second conductivity type is the n type is also possible.

In addition, silicon has been described as an example of the materials of the semiconductor substrate and the semiconductor layers. However, it is possible to use other semiconductor materials, for example, silicon carbide, gallium nitride, and the like as materials of the substrate and layers.

In addition, a trench gate type MOSFET has been implemented in the example embodiments. However, it is also possible to incorporate a planar-type MOSFET into the example embodiments.

In addition, a MOSFET which includes an SJ structure is described as an example. However, it is also possible to apply an exemplary embodiment other semiconductor device which incorporate or use the SJ structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first semiconductor layer of a first conductivity type disposed between a first electrode and a second electrode;
a second semiconductor layer of the first conductivity disposed between the first semiconductor layer and the second electrode, the second semiconductor layer having a first conductivity type dopant concentration that is greater than a first conductivity type dopant concentration of the first semiconductor layer;
a pair of third semiconductor layers of a second conductivity type and spaced from each other in a first direction, each third semiconductor layer extending in a second direction perpendicular to the first direction and having a first portion disposed in the first semiconductor layer and a second portion that is closer than the first portion to the second electrode and contacting the second semiconductor layer;
a fourth semiconductor layer of the second conductivity type between the second semiconductor layer and the second electrode and between the each third semiconductor layer and the second electrode, the fourth semiconductor layer having a second conductivity type dopant concentration that is greater than a second conductivity type dopant concentration of each of the third semiconductor layers;
a third electrode between the pair of third semiconductor layers and adjacent to the second semiconductor layer via a first insulating film; and
a fourth electrode between the second electrode and the third electrode and adjacent to the fourth semiconductor layer via a second insulating film that is thinner in the first direction than the first insulating film.

2. The device according to claim 1, wherein
a distance in the second direction from the first insulating film to the first semiconductor layer is less than a distance in the first direction from the first insulating film to a nearest one of the pair of third semiconductor layers.

3. The device according to claim 2, wherein
the third electrode and the fourth electrode are not electrically connected, and
the third electrode and the second electrode are electrically connected.

4. The device according to claim 1, wherein
the third electrode and the fourth electrode are not electrically connected, and
the third electrode and the second electrode are electrically connected.

5. The device according to claim 1, wherein
the third electrode and the pair of third semiconductor layers extend in parallel in a third direction that is perpendicular to both the first and second directions to form a stripe-shaped pattern.

6. The device according to claim 1, wherein
the pair of third semiconductor layers extend in a third direction that is perpendicular to both the first and second directions to form a stripe-shaped pattern, and
the third electrode extends in the first direction and intersects the pair of third semiconductor layers.

7. The device according to claim 1, wherein the pair of third semiconductor layers are cylindrical columns.

8. The device according to claim 1, further comprising:
a fifth semiconductor layer of the first conductivity type disposed between the fourth semiconductor layer and the second electrode, the fifth semiconductor layer having a first conductivity type dopant concentration that is greater than the first conductivity type dopant concentration of the second semiconductor layer; and
a sixth semiconductor layer of the second conductivity type between the fourth semiconductor layer and the second electrode, a second conductivity type dopant concentration of the sixth semiconductor layer being greater than the second conductivity type dopant concentration of the fourth semiconductor layer.

9. The device according to claim 1, further comprising:
a semiconductor substrate of the first conductivity type between the first electrode and the first semiconductor layer, the semiconductor substrate having a first conductivity type dopant concentration greater than the first conductivity type dopant concentration of the first semiconductor layer.

10. A semiconductor device, comprising:
a first semiconductor layer of a first conductivity type disposed between a first electrode and a second electrode;
a plurality of second semiconductor layers of the first conductivity between the first semiconductor layer and the source electrode, the second semiconductor layers having a first conductivity type dopant concentration that is greater than a first conductivity type dopant concentration of the first semiconductor layer and being spaced from each other in a first direction;
a plurality of third semiconductor layers of a second conductivity type that each have a first portion disposed in the first semiconductor layer and a second portion that is closer than the first portion to the second electrode and contacting the second semiconductor layer;
a plurality of fourth semiconductor layers of the second conductivity type that are between the second semiconductor layers and the second electrode and between the third semiconductor layers and the second electrode, the fourth semiconductor layers having a second conductivity type dopant concentration that is greater than a second conductivity type dopant concentration of the third semiconductor layers;

a field plate electrode in each of the second semiconductor layers with a first insulating film being between the field plate electrode and the second semiconductor layer; and a gate electrode between the second electrode and each field plate electrode and contacting one of the plurality of the fourth semiconductor layers via a second insulating film, a thickness of the first insulating film between the field plate electrode and the second semiconductor layer being greater than a thickness of the second insulating film between the gate electrode and the one of the plurality of fourth semiconductor layers.

11. The device according to claim 10, wherein a distance in the second direction from the first insulating film to the first semiconductor layer is less than a distance in the first direction from the first insulating film to a nearest one of the plurality of third semiconductor layers.

12. The device according to claim 10, wherein
the field plate electrode is electrically separated from the gate electrode, and
the field plate electrode and the second electrode are electrically connected.

13. The device according to claim 10, wherein the field plate electrode is electrically connected to the gate electrode, but the field plate electrode and the gate electrode are physically separated from each other by insulating material.

14. The device according to claim 10, wherein
the plurality of third semiconductor layers extend in a third direction perpendicular to the first and second direction in a stripe-shaped pattern, and
each field plate electrode extends in the second direction in a striped-shaped pattern.

15. The device according to claim 10, further comprising:
a plurality of fifth semiconductor layers of the first conductivity disposed between the plurality of fourth semiconductor layers and the second electrode, the fifth semiconductor layers having a first conductivity type dopant concentration that is greater than the first conductivity type dopant concentration of the second semiconductor layers; and
a sixth semiconductor layer of the second conductivity type between the plurality of fourth semiconductor layers and the second electrode, a second conductivity type dopant concentration of the sixth semiconductor layer being greater than the second conductivity type dopant concentration of the fourth semiconductor layer; and
a semiconductor substrate of the first conductivity type between the drain electrode and the first semiconductor layer, a first conductivity type dopant concentration of the semiconductor substrate being greater than the first conductivity type dopant concentration of the first semiconductor layer.

16. The semiconductor device of claim 10, wherein each third semiconductor layer is a cylindrical column extending in the second direction and the plurality third semiconductor layers forms a regular array of equally spaced cylindrical columns.

17. A semiconductor device, comprising:
a first electrode and a second electrode separated from each other in a first direction by a semiconductor material;
a first region of the semiconductor material having a first conductivity type;
a second region of the semiconductor material having the first conductivity and being between the first semiconductor layer and the second electrode, the second region having a first conductivity type dopant concentration that is greater than a first conductivity type dopant concentration of the first region;
a third region and a fourth region of the semiconductor material, the third and fourth regions being spaced from each other in a second direction substantially perpendicular to the first direction and having a second conductivity type, the third and fourth regions each extending in the first direction and having a first portion adjacent to the first region and a second portion adjacent to second region;
a fifth region of the semiconductor material having the second conductivity type and being between the second region and the second electrode and between each of the third and fourth regions and the second electrode, the fifth region having a second conductivity type dopant concentration that is greater than a second conductivity type dopant concentration of the third region and the fourth region;
a sixth region of the semiconductor material having the first conductivity type and being between the fifth region and the second electrode, the sixth region having a first conductivity type dopant concentration that is greater than the first conductivity type dopant concentration of the second region;
a third electrode disposed in the semiconductor material and adjacent in the second direction to the second region via a first insulating film;
a fourth electrode disposed in the semiconductor material and being between the second electrode and the third electrode in the first direction and adjacent in the second direction to the fifth region via a second insulating film having a thickness in the second direction that is less than a thickness in the second direction of the first insulating film.

18. The semiconductor device of claim 17, wherein the third and fourth electrodes are separated in the first direction from each other by an insulating material.

19. The semiconductor device of claim 17, wherein the third and fourth regions extend in parallel with each other in a third direction that is perpendicular to the first and second directions, and the third electrode extends in the second direction.

20. The semiconductor device of claim 17, wherein the third and fourth regions are cylindrical columns extending in the first direction.

* * * * *